United States Patent
Ma et al.

(10) Patent No.: US 6,943,495 B2
(45) Date of Patent: Sep. 13, 2005

(54) MICRO ELECTRO MECHANICAL SYSTEM CONTROLLED ORGANIC LED AND PIXEL ARRAYS AND METHOD OF USING AND OF MANUFACTURING SAME

(75) Inventors: Kelvin Ma, Clifton Park, NY (US); Ji-Ung Lee, Niskayuna, NY (US); Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 292 days.

(21) Appl. No.: 10/447,244

(22) Filed: May 28, 2003

(65) Prior Publication Data

US 2004/0007970 A1 Jan. 15, 2004

Related U.S. Application Data

(63) Continuation of application No. 09/618,665, filed on Jul. 18, 2000, now Pat. No. 6,677,709.

(51) Int. Cl.[7] .................. H05B 33/00; H01H 13/50
(52) U.S. Cl. .................. 313/504; 313/506; 200/512; 200/514; 315/169.3
(58) Field of Search ............................. 313/504–506, 313/500, 502, 509; 428/690, 917; 315/169.3, 169.1; 200/512, 514, 314

(56) References Cited

U.S. PATENT DOCUMENTS

| | | | |
|---|---|---|---|
| 4,182,553 A | 1/1980 | Sheridon | |
| 5,210,472 A | 5/1993 | Casper et al. | |
| 5,367,585 A | 11/1994 | Ghezzo et al. | |
| 5,669,486 A | 9/1997 | Shima | |
| 5,680,160 A | 10/1997 | LaPointe | |
| 5,748,159 A | 5/1998 | Nishio et al. | |
| 5,818,174 A | 10/1998 | Ohara et al. | |
| 5,844,362 A | 12/1998 | Tanabe et al. | |
| 5,871,088 A | 2/1999 | Tanabe | |
| 5,874,803 A | 2/1999 | Garbuzov et al. | |
| 5,901,834 A | 5/1999 | Inubushi et al. | |
| 5,950,808 A | 9/1999 | Tanabe et al. | |
| 5,962,962 A | 10/1999 | Fujita et al. | |
| 6,037,719 A | 3/2000 | Yap et al. | |
| 6,091,197 A | 7/2000 | Sun et al. | |

FOREIGN PATENT DOCUMENTS

WO        9634417        10/1996

OTHER PUBLICATIONS

James H. Smith et al., Selecting a Process Paradigm for an Emergent Disruptive Technology: "Evidence from the Emerging Microsystem Technology Base at Sandia Nationals Labs", 4 pages.

R. Watts et al., Electromechanical Optical Switching and Modulation in Micromachined Silicon–on–Insulator Waveguides, IEEE International Silicon–on–Insulator Conf. Proc., pp 62–63 (1991).

Chung–Hih Wu et al., Efficient Organic Electroluminescent Devices Using Single–Layer Doped Polymer Thin Films with Bipolar Carrier Transport Abilities, 44 IEEE Trans.on Electron Devices, pp. 1269–1281, (Aug. 1997).

Primary Examiner—Karabi Guharay
(74) Attorney, Agent, or Firm—Jason K. Klindtworth; Jean K. Testa

(57) ABSTRACT

Organic light emitting devices are disclosed that use a micro electromechanical system (MEMS) structure to enable a pixel and pixel array wherein each pixel contains a MEMS and an OLED element. A MEMS structure is used for switching the OLED element. These OLED/MEMS pixels can be fabricated on flex circuit, silicon, as well as other inorganic materials. They can be fabricated in a large array for developing a 2-dimensional display application and each pixel can be addressed through conventional matrix scanning addressing scheme. The ability of fabricating these OLED/MEMS pixels on flexible organic substrates as well as other rigid substrates enables wider selection of substrate materials for use with different applications.

20 Claims, 5 Drawing Sheets

MICRO ELECTRO MECHANICAL SYSTEM CONTROLLED ORGANIC LED AND PIXEL ARRAYS AND METHOD OF USING AND OF MANUFACTURING SAME

CROSS REFERENCE TO RELATED APPLICATION

This patent application is a continuation application of U.S. patent application having Ser. No. 09/618,665, now U.S. Pat. No. 6,677,709 filed on Jul. 18, 2000, which is incorporated herein by reference in its entirety. Applicants claim the benefit of the filing date of U.S. patent application Ser. No. 09/618,665.

BACKGROUND OF THE INVENTION

The present invention relates generally to light emitting elements and displays. More particularly, the present invention relates to an organic light emitting device that is controlled by a micro electromechanical system, a display constructed thereof, and a method of using and manufacturing the same.

Current flat panel liquid crystal display (LCD) technology uses a rigid substrate, such as glass, with thin film transistors (TFTs) corresponding to each display pixel. Due to the brittle nature of glass, the displays cannot withstand large amounts of mechanical vibration and/or pressure. This can be a major disadvantage for portable display applications, such as portable digital assistants (PDAs), which by their portable nature, can be exposed to a large amount of shock and abuse. Also, the properties of the LCD limit the operating temperature range of the device. Due to these limitations, other technologies, such as field emission displays (FEDs), in which electron emitters are controlled by cold cathodes to emit light, and organic light emitting devices (OLEDs) have emerged to overcome some of these limitations.

There have been several developments in FED technology. For example, U.S. Pat. No. 5,210,472 discloses a FED design which utilizes a matrix-addressable array of pointed, thin-film, cold emission cathodes in combination with a phosphor luminescent screen. The FED disclosed in U.S. Pat. No. 5,210,472 incorporates a column signal to activate a single conductive strip within the cathode grid, while a row signal activates a conductive strip within the emitter base electrode. At the intersection of both an activated column and an activated row, a grid-to-emitter voltage differential exists sufficient to induce a field emission, thereby causing illumination of the associated phosphor of a pixel on the phosphorescent screen. However, FEDs generally require tight tolerances for spacing between the emitters, the cold cathodes, and a phosphor screen in order for the electrons to pass through the gates and hit the phosphors. These requirements preclude the use of a flexible substrate, such as a polymer substrate, for the FED because flexure of the substrate would cause the spacing size to move out of acceptable tolerance.

An organic light emitting device (OLED) is typically a laminate formed on a substrate such as glass or silicon. A light-emitting layer of a luminescent organic solid is sandwiched between a cathode and an anode. The OLED may also include hole-injecting or electron-injecting layers. The light-emitting layer may be selected from a number of known fluorescent organic solids. The light-emitting layer may consist of multiple sublayers or a single blended layer. When a potential difference is applied across the device, electrons move from the cathode into the layer(s) of organic material. At the same time, holes move from the anode into the same organic light-emitting layer(s). When the holes and electrons meet in the layer(s) of organic material, they combine and produce photons. The wavelength of the photons depends on the material properties of the organic material in which the photons are generated. The color of light emitted from the OLED can be controlled by the selection of the organic material or by the selection of dopants, or by other techniques known in the art. In a typical OLED, either the anode or the cathode is transparent in order to allow the emitted light to pass through and out of the device.

U.S. Pat. No. 5,962,962 describes a basic organic light emitting device. The OLED has a structure in which an anode, an organic light emitting layer, and a cathode are consecutively laminated. Generally, electrical current flowing between the anode and cathode passes through points of the organic light emitting layer and causes it to luminesce. The electrode positioned on the surface through which light is emitted is formed of a transparent or semi-transparent film. The other electrode is formed of a specific thin metal film, which can be a metal or an alloy.

Known OLED displays use either a traditional passive or a thin film transistor (TFT) approach for creating and addressing a large number of 2-dimensional array pixels. Although the passive approach uses less power, it is difficult to maintain display uniformity over the entire display area. The TFT approach allows for better display uniformity but requires a high temperature fabrication process. This high temperature process requirement generally prevents any organic substrate from being used because of the breakdown in organic materials at high temperatures. As a result, most current OLEDs include a TFT formed separately on a glass substrate for the build-up process. Accordingly, conventional OLED display devices are not flexible and shock resistant. Another problem that arises when using TFTs as an addressing mechanism for pixels is that a certain amount of cross talk is almost unavoidable from each scanned row to the next scanned row.

It would be desirable to provide a resiliently flexible display that exhibits the advantages of organic light emitting device technology and avoids the disadvantages conventional devices, such as excessive cross talk.

BRIEF SUMMARY OF THE INVENTION

Organic light emitting devices use a micro electromechanical system (MEMS) structure to control the display characteristics of a pixel and/or a pixel array wherein each pixel contains a MEMS and an OLED element. A MEMS structure is used for controlling the OLED element, for example, switching the OLED element on and off, and controlling the intensity of the OLED. The MEMS controlled OLED pixels can be fabricated on a flexible substrate. Additionally, the MEMS controlled OLEDs can be fabricated in an array for developing a 2-dimensional display where each pixel can be addressed through, for example, a conventional matrix scanning addressing scheme. The ability to fabricate the MEMS controlled OLED pixels on a flexible or rigid substrate allows a wider choice of substrate materials for use with different applications and overcomes the limitations of conventional devices.

BRIEF DESCRIPTION OF THE DRAWINGS

The features and advantages of exemplary embodiments of the present invention can be understood more completely by reading the following detailed description of the pre

DETAILED DESCRIPTION OF THE INVENTION

According to exemplary embodiments of the invention, a micro electromechanical system ("MEMS") is used as an activation switching mechanism to control an organic light emitting device ("OLED"). The combined OLED/MEMS structure can be used, for example, to form one or more pixel elements in a display. The MEMS is used for switching the OLED element on and off, and thus controlling a pixel of a display. The MEMS controlled OLED pixels can be fabricated on flexible substrates, such as thin glass or silicon, polyester (e.g. MYLAR), polyimide (e.g. KAPTON), or other polymer film, or on rigid substrates such as silicon or glass, using known fabrication techniques. Additionally, the MEMS controlled OLED pixels can be fabricated in a large array that serves as a basis for a 2-dimensional display where each pixel can be individually addressed through conventional matrix scanning addressing schemes. The ability to fabricate the MEMS controlled OLED pixels on a flexible or rigid substrate affords substantial versatility depending on the particular application or operating environment.

Figure 1:
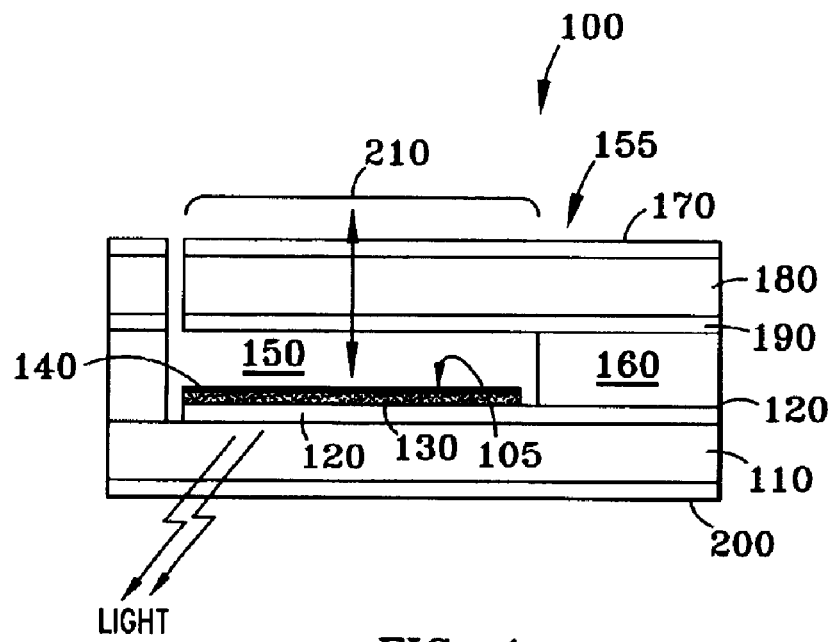
- FIG. 1 is cross sectional view of a light emitting element according to one embodiment of the invention.

A first embodiment of the invention is shown in FIG. 1. A light emitting element 100 comprises an OLED and a MEMS. The OLED 105 includes an anode 120, an organic light emitting layer 130, and a cathode 140. The OLED 105 may be formed on a transparent substrate 110, for example. The transparent substrate 110 can be a glass, polymer or other transparent material. If the substrate comprises a polymer, a sealant layer 200 can be provided to protect the OLED from air and moisture absorption through the substrate 110.

The organic light emitting layer 130 emits light upon application of a voltage across the anode and cathode. The anode and cathode inject charge carriers, i.e. holes and electrons, into the organic light emitting layer 130 where they recombine to form excited molecules or excitons which emit light when the molecules or excitons decay. The color of light emitted by the molecules depends on the energy difference between the excited state and the ground state of the molecules or excitons.

The cathode 140 generally comprises a material having a low work function value such that a relatively small voltage causes emission of electrons from the cathode. The cathode 140 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 120 typically comprises a material having a high work function value. The anode 120 is preferably transparent so that light generated in the organic light emitting layer 130 can propagate out of the light emitting element 100. The anode 120 may comprise, for example, indium tin oxide (ITO), tin oxide, nickel, or gold. The anode can be patterned to allow each OLED element to be individually addressed. The electrodes 120, 140 can be formed by conventional vapor deposition techniques, such as evaporation or sputtering, for example.

A variety of organic light emitting layers 130 can be used in conjunction with exemplary embodiments of the invention. According to one embodiment, the organic light emitting layer 130 comprises a single layer. The organic light emitting layer 130 may comprise, for example, a conjugated polymer which is luminescent, a hole-transporting polymer doped with electron transport molecules and a luminescent material, or an inert polymer doped with hole transporting molecules and a luminescent material. The organic light emitting layer 130 may also comprise an amorphous film of luminescent small organic molecules which can be doped with other luminescent molecules.

According to other embodiments of the invention, the organic light emitting layer 130 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 130 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Referring again to FIG. 1, the light emitting element 100 also includes a MEMS 155 coupled to the OLED 105. The MEMS is spaced from the OLED by a spacer 160. The spacer 160 creates a cavity 150 between the MEMS and the OLED which allows the MEMS to move relative to the OLED. The spacer can be formed on the OLED as follows: A layer of protective sacrificial metal (not shown) or other material is patterned on top of the OLED 105 for later etching. A layer of spacer material 160 is deposited over the protective sacrificial material to act as a spacer after the protective sacrificial material on the OLED is etched away. This spacer material 160 can be squeegeed on and planarized, for example, or deposited using other conventional methods. The spacer material 160 and the protective sacrificial material may also comprise a photo-imageable polyimide, if desired.

The MEMS 155 can be applied on the spacer 160, for example by lamination. MEMS are electromechanical systems formed on a small scale, e.g. from a few microns to a few millimeters in size. The term MEMS generally refers to a mechanical structure which is activated by an electric and/or magnetic force. MEMS can be formed using known methods such as the LIGA process, silicon surface machining, silicon bulk micro machining, and electrical discharge machining.

According to the example shown in FIG. 1, the MEMS 155 comprises an actuating member 180, a first conductive layer 170, and a second conductive layer 190. The actuating member 180 can comprise an insulating polyimide such as Kapton™, manufactured by Dupont®, for example. The first and second conductive layers 170, 190 can comprise, for example, copper, titanium, nickel or combinations of metals as is known in the art, and can be applied to the actuating member 180 by any suitable method. The first conductive metal layer 170 is typically patterned to allow for individual element actuation.

Figure 4:
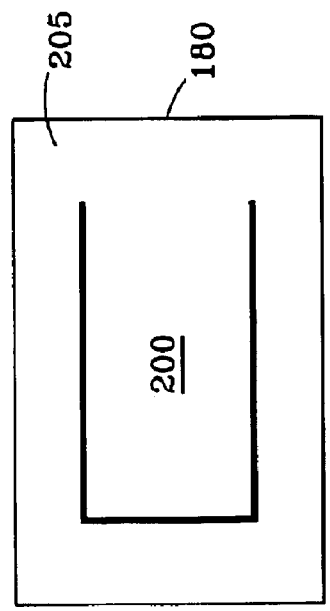

After the metal patterning of the first conductive layer 170, laser ablation, plasma etching, or other ablation technique can be used to make a cut in the actuating member 180 and the conductive layers 170, 190 to define a cantilever or other type of spring-like flexible member 210. FIG. 4 shows a top view of the cutting pattern for the cantilever member 210 of FIG. 1. The actuating member 180 typically includes a first portion 205 which is fixed with respect to an electrical contact (for example, the cathode of the OLED) and a second portion (the cantilever member 210 in this example) which moves toward and away from the electrical contact.

Figure 5:
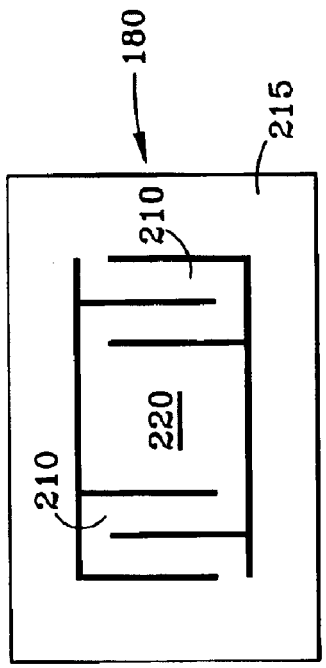
FIGS. 4–7 are top views of examples of micro electro-mechanical system spring structures that can be used with various embodiments of the invention.
Figure 7:
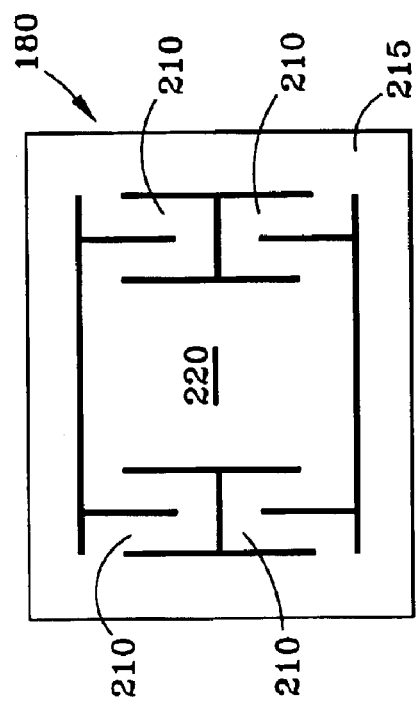
Figure 6:
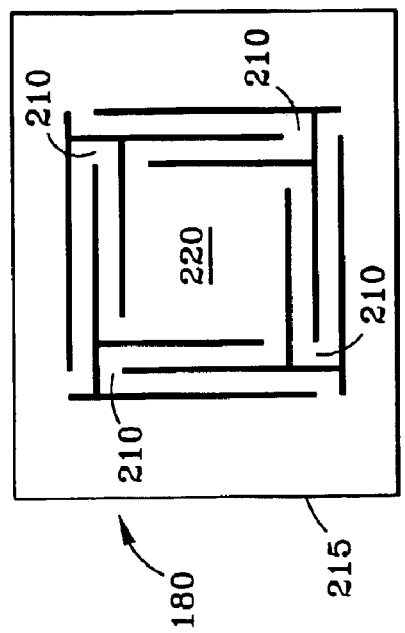

Examples of other cutting patterns for flexible members are shown in FIGS. 5–7. The specific configuration of flexible members 210 can be varied based on the desired mechanical and electrostatic properties for the MEMS. In FIGS. 5–7, the actuating members 180 include a peripheral region 215 which is fixed with respect to the electrical contact (e.g. the cathode of the OLED) and a central region 220 which moves toward and away from the electrical contact to complete and break a circuit, respectively.

After the cuts (shown in FIGS. 4–7) have been made to define the flexible members 210, the protective sacrificial material is removed through an etching process to form the cavity 150.

Referring again to FIG. 1, the light emitting element 100 is activated by applying a voltage between the first conductive layer 170 and the anode 120 of the OLED. The attractive electrostatic force generated by the electric potential bends the flexible member 210 toward the cathode 140 of the OLED until the second conductive layer 190 of the MEMS contacts the cathode 140 of the OLED. The second conductive layer 190 of the MEMS applies a control voltage to the OLED relative to the anode 120 of the OLED. The control voltage across the OLED activates the OLED to produce light. The OLED can thus be switched on an off by applying an activating voltage to the first conductive layer 170 while supplying a control voltage to the second conductive layer 190. The activating voltage used to bend the cantilever 210 by electrostatic attraction may be on the order of 10–100 volts, for example, but may be varied as desired according to the stiffness of the cantilever 210. The control voltage applied by the second conductive layer 190 across the OLED is typically 2–10 volts, but may be more or less depending on the characteristics of the OLED. Furthermore, through pulse width modulation of the control voltage, the duty cycle of the OLED, and hence its brightness, can be controlled. Alternatively, by regulating the magnitude of the control voltage applied to the OLED, the brightness of the OLED can be adjusted.

Figure 2:
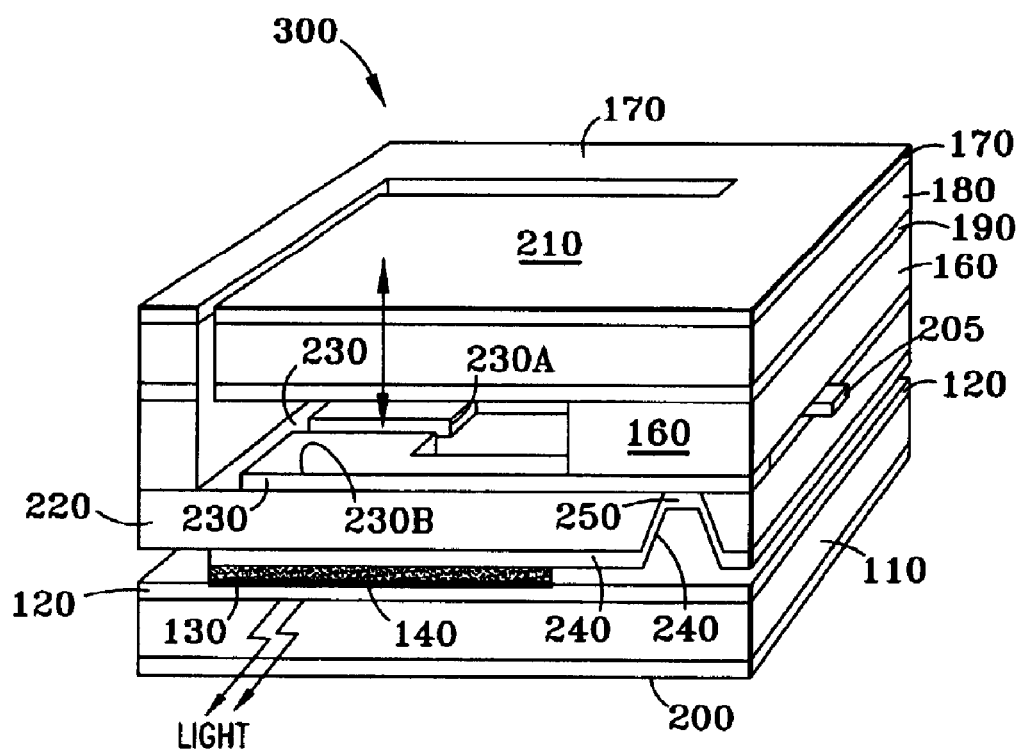
FIG. 2 is a perspective view of a light emitting element according to another embodiment of the invention.

A second embodiment of the invention is illustrated in FIG. 2. The light emitting element 300 comprises a transparent substrate 110, an anode 120, an organic light emitting layer 130, a cathode 140, a cavity 150, a spacer 160, a first conductive layer 170, an actuating member 180, a second conductive layer 190, and an optional sealant layer 200.

The light emitting element 300 also comprises a MEMS substrate 220, e.g. of polyimide, on which is patterned a contact layer 230 comprising contacts 230A and 230B. Contact 230A, which extends to 205, is connected to one side of the control voltage applied across the OLED. Contact 230B is electrically connected to the cathode 140 of the OLED by means of a connecting member 240. Thus, when the MEMS is activated, the cantilever 210 is forced downward, and the conductive layer 190 touches both contacts 230A and 230B to apply the control voltage across the OLED. The current flows from 205 to 230A to 190 to 230B to 240 to the cathode 140 of the OLED and across the OLED to produce light. As in FIG. 1, the MEMS is activated by applying an activation voltage between the first conductive member 170 and the anode 120 of the OLED, which creates an attractive electrostatic force to bend the cantilever 210 toward the contacts 230A, 230B.

The configuration of the MEMS of FIG. 2 allows the addition of the OLED element to be the last process step and thus improves yield during manufacturing. In particular, the light emitting element 300 can be formed by depositing the patterned contacts 230A, 230B on the MEMS substrate 220, and then forming the spacer 160 and MEMS structure as described above with respect to FIG. 1. A connecting member 240 is then formed in an opening 250 of the MEMS substrate 220 to provide an electrical connection between the OLED on one side of the MEMS substrate 220 and the contact 230B on the other side of the MEMS substrate 220. OLED can then be connected to the MEMS. According to a first method, the layers of the OLED are deposited directly on the connecting member 240 on the MEMS substrate 220. According to a second method, the OLED is preformed and then adhered, e.g. with a conductive epoxy, to the connecting member 240 on the MEMS substrate 220. The OLED is thus added only at the end of the manufacturing process.

Figure 3:
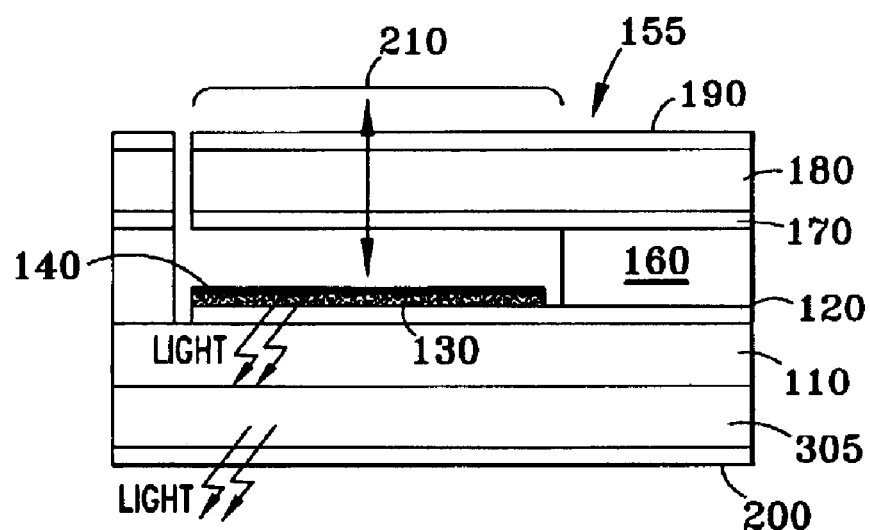
FIG. 3 is a cross sectional view of a light emitting element according to another embodiment of the invention.

FIG. 3 illustrates another embodiment of the invention. The light emitting element in FIG. 3 includes a layer of phosphor material 305 on the transparent substrate 110. The phosphor layer absorbs some or all of the light emitted by the OLED and emits light of a different wavelength. The phosphor layer 305 is typically sandwiched between the substrate 110 and the sealant layer 200, but it could function in any location where it is exposed to sufficient illumination from the OLED. The phosphor layer 305 can be selected to have a sufficient decay time to allow each pixel, i.e. OLED, to sustain the light level during scanning process to reduce any flicker effect of the display at low scan rates. Alternatively, phosphors of different emitting colors can be patterned onto different pixels of an array of pixels to allow a full color display.

Figure 8:
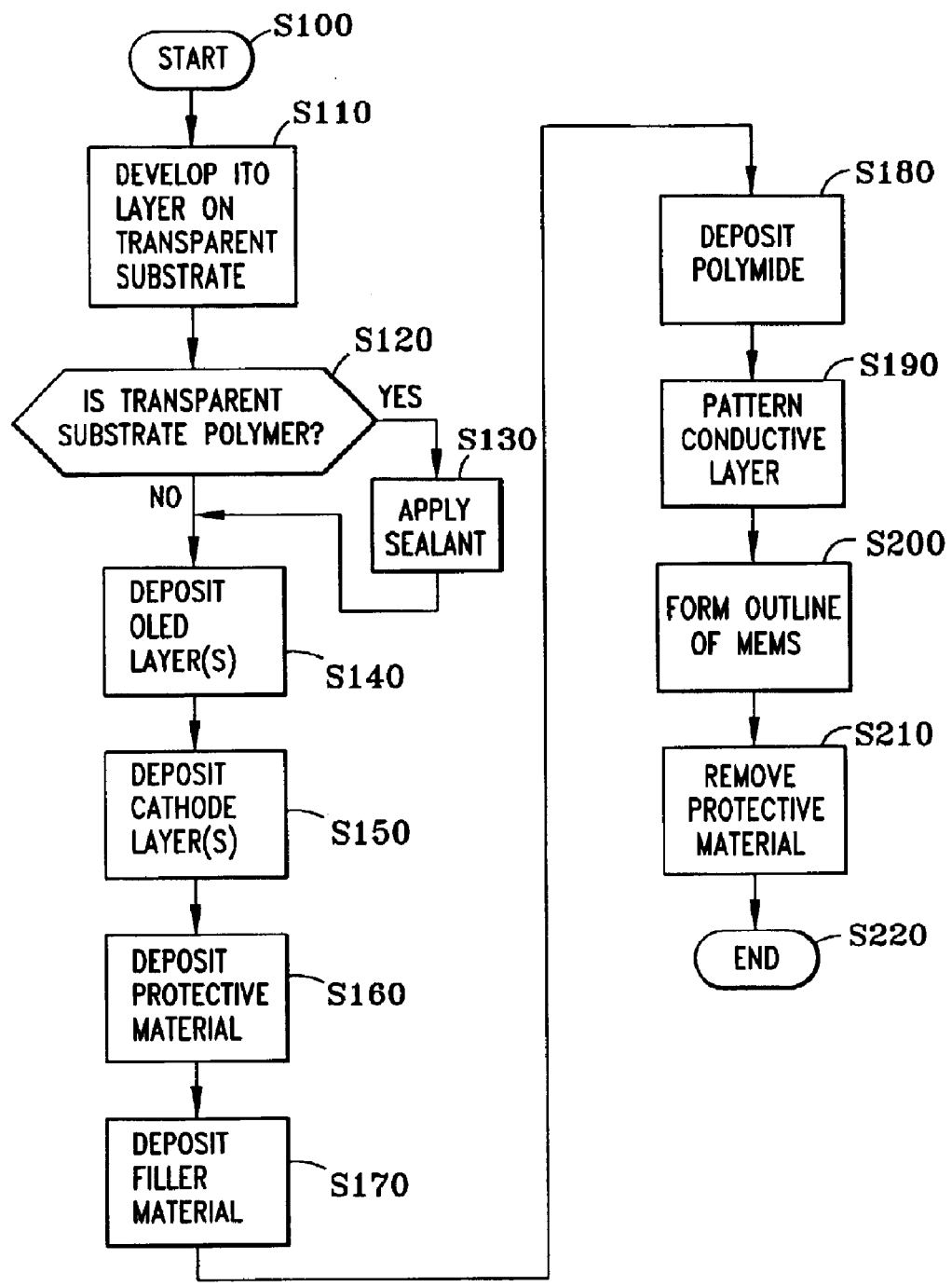
FIG. 8 is a flow chart of an exemplary method of making light emitting elements.

An exemplary method of making a MEMS controlled OLED pixel is illustrated in FIG. 8. A patterned anode is developed on the transparent substrate to allow each individual OLED element to be controlled by application of a control voltage (S110). Next, if the transparent substrate 110 is made of a polymer (S120), sealant can be applied to the substrate in order to protect the transparent substrate from air and moisture absorption (S130). If the transparent substrate is not made of a polymer, then the organic light emitting layer is deposited (S140). The deposition is achieved through the use of an ink jet, shadow mask or other known patterning technique. A cathode layer 140 is then deposited (S150).

A protective sacrificial material can then patterned on top of the OLED (S160). Next, spacer material 160 is placed on top of and adjacent to the protective sacrificial material (S170) in order to create the desired spacing when the protective sacrificial material is removed. The portion of the spacer material over the OLED is typically removed through conventional patterning methods. The spacer material 160 can be deposited by known deposition techniques including the use of a squeegee. Both the spacer material 160 and protective sacrificial material can comprise photo-imageable polyimide, for example.

The polyimide layer 180, such as Kapton™, with copper developed on both sides thereof, as layers 170 and 190, is laminated on top of the spacer 160 (S180). The copper layer 170 can be patterned to allow for individual actuation of the light emitting element (S190). After the metal patterning of the top surface, a laser ablation, plasma etching, or other technique can be employed to cut the polyimide material as well as the copper underneath the polyimide material to define flexible members 210 of the MEMS (S200), for example as shown in FIGS. 4–7. The protective sacrificial material is then removed (S210) and the process ends (S220).

Figure 9:
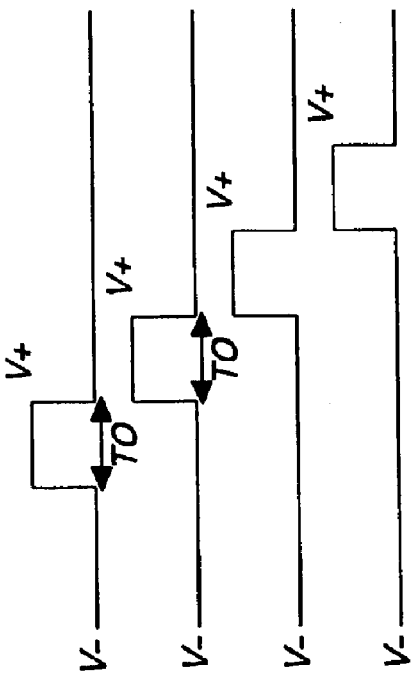
FIG. 9 is a diagram illustrating an example of an addressing scheme for a display in accordance an exemplary embodiment of the invention.
Figure 9:
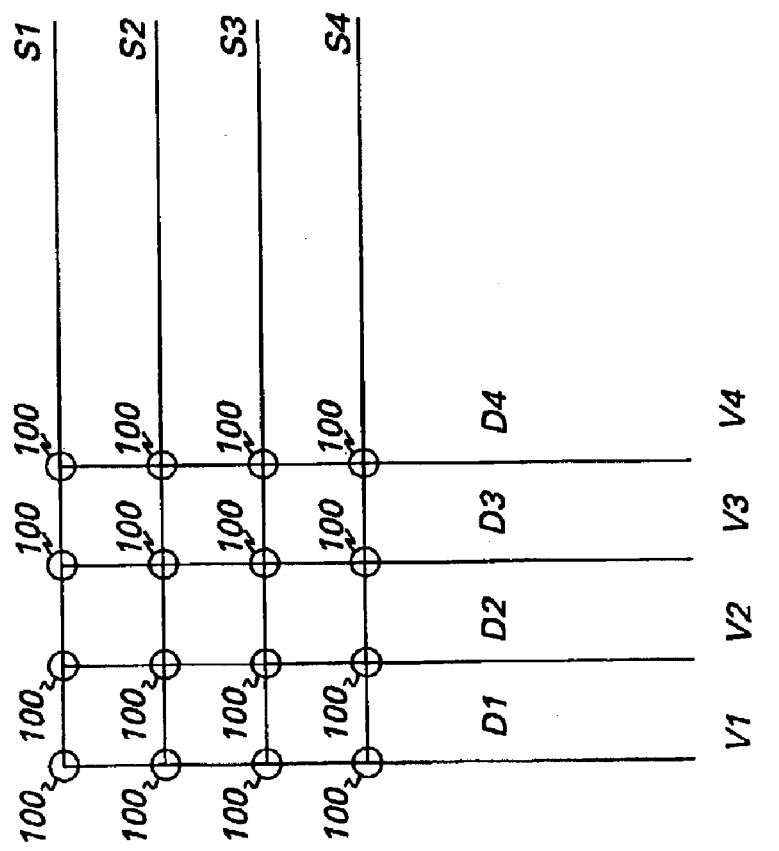

FIG. 9 schematically illustrates an example of an addressing and control scheme for a display comprising an array of light emitting elements each defining a pixel of the display. Row address lines S1–S4 are coupled to the conducting layers 170 of flexible members 210 of the MEMS structures of each pixel in a corresponding row. Column address lines D1–D4 are coupled to the conductive layer 190 of each pixel in a corresponding column. Accordingly, placing the proper voltage on row address line S1 will actuate the flexible members 210, in the manner described above, of the first row of light emitting elements 100. Similarly, placing the proper voltage on row address lines S2–S4 will actuate flexible members 210 of the corresponding rows of light emitting elements 100. In this manner, a particular row can be addressed for actuation. Note that flexible members either are actuated, i.e. deflected to contact the OLED, or are not actuated. Accordingly, rows are either in an ON or an OFF state at any particular time.

Once a particular row is placed in an ON state, the pixels of that row can be controlled by application of control voltages V1–V4 to the OLEDs of the selected row by means of conductive layer 190. Accordingly, an entire row of pixels can be actuated and controlled at one time. Further, as described above, the brightness of individual OLEDs in the selected row can be controlled. For example, the magnitude of each of the control voltages V1–V4 applied to column address lines D1–D4 can be varied to control the brightness of each pixel independently. Alternatively, pulse width modulation techniques can be applied to the control voltages to cycle the individual OLEDs in a desired manner to control brightness. One or more rows can be selected at a time. Of course, there can be any number of pixels in a display. Further, any of the embodiments discussed above can utilize the addressing and control scheme illustrated in FIG. 9.

It can be appreciated by those skilled in the art that there are various modifications that could be made to the described structure. For example, additional layers with spacing can be placed on top of the OLED to protect the OLED operating environment, and an additional electrode could be included for electrostatic actuation for pulling the MEMS actuating member back up, creating a push-pull mechanism. The MEMS/OLED device can also be placed in a sealed, inert enclosure to extend its lifetime. Various known techniques can be used for forming the various elements. The MEMS can be of any configuration that permits if to be operatively coupled to the OLED to act as an activation switching mechanism.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. A light emitting element comprising:
an organic light emitting device comprising an anode, a cathode, and an organic light emitting material disposed between the anode and the cathode; and
a micro electromechanical system coupled to the organic light emitting device such that actuation of the micro electromechanical system activates the organic light emitting device to produce light; wherein the micro electromechanical system comprises a first conductive layer, a second conductive layer, and an actuating member sandwiched between the first conductive layer and the second conductive layer; the micro electromechanical system forms a cantilever extending over the cathode of the organic light emitting device and is spaced apart therefrom when the micro electromechanical system is in an unactuated state; and the micro electromechanical system is actuated by a voltage applied across the anode and the first conductive layer.

2. The light emitting element of claim 1, wherein the actuating member is operative to move from a first position in which the organic light emitting device is not activated to a second position in which the organic light emitting device is activated.

3. The light emitting element of claim 2, the first conductive layer is disposed on a first side of the actuating member and the second conductive layer is disposed on a second side of the actuating member, the first conductive layer electromechanically operative to force the actuating member toward the organic light emitting device upon application of voltage between the first conductive layer and the anode of the organic light emitting device and the second conductive layer operative to supply a current to the organic light emitting device to activate the organic light emitting device to generate light.

4. The light emitting element of claim 2, further comprising a spacing member, adjacent to the actuating member, which spaces the actuating member from an electrical contact.

5. The light emitting element of claim 1, wherein the micro electromechanical system comprises a flexible actuating member, the flexible actuating member comprising:
a first portion which is fixed with respect a contacting surface and spaced from the contacting surface; and
a second portion which can be forced to contact the contacting surface.

6. The light emitting element of claim 5, wherein the contacting surface is a surface of a contact which is electrically connected to the cathode or anode of the organic light emitting device.

7. The light emitting element of claim 5, wherein the first portion and the second portion of the actuating member are partially separated by a space to allow the second portion to move toward the contacting surface with respect to the first portion.

8. The light emitting element of claim 7, wherein the first portion occupies a peripheral region of the micro electromechanical system, and the second portion occupies a central region of the micro electromechanical system.

9. The light emitting element of claim 1, wherein the organic light emitting device is formed on a flexible substrate, and the micro electromechanical system is fixed to the flexible substrate.

10. The light emitting element of claim 1, wherein the organic light emitting device is formed on a rigid substrate and the micro electromechanical system is fixed to the rigid substrate.

11. The light emitting element of claim 1, further comprising:
a phosphor layer which absorbs light having a first wavelength from the organic light emitting device and which emits light having a second wavelength.

12. The light emitting element of claim 1, wherein the organic light emitting device and the micro electromechanical system are adapted for use in a flat panel display.

13. The light emitting element of claim 1, wherein the organic light emitting device and the micro electromechanical system are adapted for use in an array of light emitting elements.

14. The light emitting element of claim 1, further comprising a polymeric substrate on which the organic light emitting device is disposed.

15. A method of manufacturing a light emitting element comprising the steps of:
forming an organic light emitting device by disposing an organic light emitting material between an anode and a cathode; and
forming a micro electromechanical system which is coupled to the organic light emitting device such that an electrical actuation of the micro electromechanical system activates the organic light emitting device to produce light; said forming the micro electromechanical system comprising:
forming a cantilever that comprises an actuating member sandwiched between a first conductive layer and a second conductive layer; and
disposing the cantilever over the cathode of the organic light emitting device such that upon the electrical actuation of the micro electromechanical system, one of the conductive layers of the cantilever makes an electrical contact with an electrode of the organic light emitting device.

16. The method of claim 15, wherein the organic light emitting device is formed on a substrate, and the micro electromechanical system is formed adjacent to the organic light emitting device such that the micro electromechanical system, when actuated, contacts an electrode of the organic light emitting device to activate the organic light emitting device.

17. The method as recited in claim 15, wherein the step of forming a micro electromechanical system comprises forming a cantilever member operative to move from a first position in which the organic light emitting device is not activated to a second position in which the organic light emitting device is activated.

18. The method as recited in claim 15, wherein the step of forming a micro electromechanical system comprises forming a flexible cantilever portion having a first conductive layer and a second conductive layer and being operative to flex towards an electrical contact when an electric potential is applied to the first conductive layer.

19. The method as recited in claim 15, further comprising the step of forming a layer of phosphor material which receives light from the organic light emitting device.

20. A light emitting element comprising:
an organic light emitting device comprising an organic light emitting material disposed between an anode and a cathode; and
a structure comprising an electrically conductive material for electromechanically activating the organic light emitting device; said structure forming a cantilever and being disposed to extend over the cathode of the organic light emitting device and to be spaced apart therefrom when said structure is in an unactuated state; and said electrically conductive material of said structure in an actuated state making an electrical contact with an electrode of said organic light emitting device.

* * * * *